(12) United States Patent
Chen et al.

(10) Patent No.: US 11,763,134 B2
(45) Date of Patent: Sep. 19, 2023

(54) SYSTEMS AND METHODS FOR IMAGE RECONSTRUCTION

(71) Applicant: SHANGHAI UNITED IMAGING INTELLIGENCE CO., LTD., Shanghai (CN)

(72) Inventors: Zhang Chen, Cambridge, MA (US); Shanhui Sun, Cambridge, MA (US); Terrence Chen, Cambridge, MA (US)

(73) Assignee: SHANGHAI UNITED IMAGING INTELLIGENCE CO., LTD., Shanghai (CN)

( * ) Notice: Subject to any disclaimer, the term of this patent is extended or adjusted under 35 U.S.C. 154(b) by 644 days.

(21) Appl. No.: 16/749,964

(22) Filed: Jan. 22, 2020

(65) Prior Publication Data

US 2021/0224634 A1 Jul. 22, 2021

(51) Int. Cl.
*G06N 3/045* (2023.01)
*G06N 3/08* (2023.01)
*G01R 33/56* (2006.01)
*G01R 33/561* (2006.01)

(52) U.S. Cl.
CPC ......... *G06N 3/045* (2023.01); *G01R 33/5608* (2013.01); *G01R 33/5611* (2013.01); *G06N 3/08* (2013.01); *G06T 2207/20081* (2013.01); *G06T 2207/20084* (2013.01)

(58) Field of Classification Search
None
See application file for complete search history.

(56) References Cited

U.S. PATENT DOCUMENTS

| | | | |
|---|---|---|---|
| 10,012,716 B2* | 7/2018 | Kang | G01R 33/5611 |
| 2017/0007148 A1* | 1/2017 | Kaditz | A61B 5/055 |
| 2017/0011255 A1* | 1/2017 | Kaditz | G01R 33/48 |
| 2017/0285122 A1* | 10/2017 | Kaditz | G01R 33/445 |
| 2017/0285123 A1* | 10/2017 | Kaditz | G01R 33/5608 |
| 2020/0005497 A1* | 1/2020 | Arberet | G01R 33/5608 |
| 2020/0034998 A1* | 1/2020 | Schlemper | G06V 10/768 |
| 2020/0249300 A1* | 8/2020 | Sandino | G01R 33/5608 |

OTHER PUBLICATIONS

Richy T. Q. Chen et al., Neural Ordinary Differential Equations, Advances in Neural Information Processing Systems, 2018, 19 pages.

* cited by examiner

*Primary Examiner* — Jiangeng Sun
(74) *Attorney, Agent, or Firm* — METIS IP LLC

(57) ABSTRACT

A system for image reconstruction in magnetic resonance imaging (MRI) is provided. The system may obtain undersampled k-space data associated with an object, wherein the undersampled K-space data may be generated based on magnetic resonance (MR) signals collected by an MR scanner that scans the object. The system may construct an ordinary differential equation (ODE) that formulates a reconstruction of an MR image based on the undersampled k-space data. The system may further generate the MR image of the object by solving the ODE based on the undersampled k-space data using an ODE solver.

18 Claims, 9 Drawing Sheets

500

510 — Obtaining undersampled k-space data associated with an object, the undersampled k-space data being generated based on MR signals collected by an MRI scanner that scans the object 520 — Constructing an ODE that formulates a reconstruction of an MR image based on the undersampled k-space data 530 — Generating the MR image of the object by solving the ODE based on the undersampled k-space data using an ODE solver

| Obtaining a plurality of training samples, each of the plurality of training samples including a training undersampled MR image and a corresponding ground truth MR image of a training object | ~ 610 |

↓

| Obtaining a preliminary model having one or more model parameters | ~ 620 |

↓

| Generating a trained neural network model by iteratively updating values of the one or more model parameters of the preliminary model based on the plurality of training samples | ~ 630 |

FIG. 6

SYSTEMS AND METHODS FOR IMAGE RECONSTRUCTION

TECHNICAL FIELD

The disclosure generally relates to image reconstruction, and more particularly, relates to systems and methods for image reconstruction using an ordinary differential equation (ODE).

BACKGROUND

Medical imaging, such as magnetic resonance imaging (MRI) is widely used in disease diagnosis and/or treatment for various medical conditions (e.g., tumors, coronary heart diseases, or brain disease). Image reconstruction is a key technology used in the field of medical imaging to transform scan data into an image. Conventionally, image reconstruction is performed by solving an optimization problem based on the scan data, which is time-consuming and need a large amount of calculation resources. Therefore, it is desirable to provide systems and methods for image reconstruction, thereby improving the efficiency and accuracy of medical analysis and/or diagnosis.

SUMMARY

An aspect of the present disclosure relates to a system for image reconstruction in MRI. The system may include at least one storage device including a set of instructions and at least one processor in communication with the at least one storage device. When executing the set of instructions, the at least one processor may be directed to perform operations. The operations may include obtaining undersampled k-space data associated with an object, wherein the undersampled K-space data may be generated based on magnetic resonance (MR) signals collected by an MR scanner that scans the object. The operations may further include constructing an ODE that formulates a reconstruction of an MR image based on the undersampled k-space data, and generating the MR image of the object by solving the ODE based on the undersampled k-space data using an ODE solver.

In some embodiments, the constructing an ODE that formulates a reconstruction of an MR image based on the undersampled k-space data may include formulating the reconstruction of the MR image based on the undersampled k-space data into a discrete optimization process, and constructing the ODE by transforming the discrete optimization process into a continuous optimization process, wherein the ODE may model a rate of change of a solution during the continuous optimization process.

In some embodiments, the generating the MR image of the object by solving the ODE based on the undersampled k-space data using an ODE solver may include reconstructing an undersampled MR image of the object based on the undersampled k-space data as an initial value of the ODE, and generating the MR image of the object by solving the ODE based on the initial value using the ODE solver.

In some embodiments, the ODE solver may be a trained neural network model. The generating the MR image of the object by solving the ODE based on an initial value using the ODE solver may include obtaining the MR image of the object by inputting the undersampled MR image into the trained neural network model.

In some embodiments, the trained neural network model may include a Convolutional Neural Network (CNN) model, a convolutional Recurrent Neural Network (RNN) model, and/or a Cascaded Neural Network model.

In some embodiments, the trained neural network model may include a plurality of sequentially connected sub-models. The plurality of sequentially connected sub-models may include a first sub-model and one or more second sub-models downstream to the first sub-model. At least one of the one or more second sub-models may include a convolutional model and a data consistency (DC) layer connected to the convolutional model. The convolutional model may be configured to process an output of a previous sub-model connected to the at least one sub-second model and generate an intermediate MR image. The DC layer may be configured to output an updated intermediate MR image based on the intermediate MR image and the undersampled k-space data. The MR image of the object may be an output of the last second sub-model of the one or more second sub-models.

In some embodiments, the trained neural network model may be generated according to a model training process. The model training process may include obtaining a plurality of training samples, each of the plurality of training samples including a training undersampled MR image and a corresponding ground truth MR image of a training object. The model training process may also include obtaining a preliminary model having one or more model parameters. The model training process may further include generating the trained neural network model by iteratively updating values of the one or more model parameters of the preliminary model based on the plurality of training samples.

In some embodiments, the iteratively updating values of the one or more model parameters of the preliminary model may include performing an iterative operation including one or more iterations. Each of at least one iteration of the iterative operation may include for each of at least a portion of the plurality of training samples, generating a predicted MR image of the corresponding training object by inputting the training undersampled MR image into an updated preliminary model determined in a previous iteration. Each of at least one iteration of the iterative operation may also include determining a value of a loss function of the updated preliminary model based on the predicted MR image and the ground truth MR image of each of the at least a portion of the plurality of training samples. Each of at least one iteration of the iterative operation may further include updating values of the one or more model parameters of the updated preliminary model to be used in a next iteration based on the value of the loss function.

In some embodiments, the updating values of the one or more model parameters of the updated preliminary model to be used in a next iteration based on the value of the loss function may include determining a gradient descent based on the value of the loss function according to an adjoint sensitivity algorithm, and updating values of the one or more model parameters of the updated preliminary model by backpropagating the gradient descent.

In some embodiments, the obtaining a preliminary model having one or more model parameters may include obtaining a non-trainable ODE solver, and constructing the preliminary model based on the non-trainable ODE solver.

In some embodiments, the ODE solver may include an Euler's algorithm, a midpoint algorithm, and/or a Runge-Kutta algorithm.

A further aspect of the present disclosure relates to a method for image reconstruction in MRI. The method may be implemented on a computing device including at least one processor and at least one storage device. The method may include obtaining undersampled k-space data associated with an object, wherein the undersampled K-space data may be generated based on MR collected by an MR scanner that scans the object. The method may further include constructing an ODE that formulates a reconstruction of an MR image based on the undersampled k-space data, and generating the MR image of the object by solving the ODE based on the undersampled k-space data using an ODE solver.

A still further aspect of the present disclosure relates to a non-transitory computer readable medium including executable instructions. When the executable instructions are executed by at least one processor, the executable instructions may direct the at least one processor to perform a method. The method may include obtaining undersampled k-space data associated with an object, wherein the undersampled K-space data may be generated based on MR signals collected by an MR scanner that scans the object. The method may further include constructing an ODE that formulates a reconstruction of an MR image based on the undersampled k-space data, and generating the MR image of the object by solving the ODE based on the undersampled k-space data using an ODE solver.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 5 is a flowchart illustrating an exemplary process for reconstructing an MR image of an object according to some embodiments of the present disclosure;

FIG. 6 is a flowchart illustrating an exemplary process for generating a trained neural network model according to some embodiment of the present disclosure;

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "device," "unit," "module," and/or "block" used herein are one method to distinguish different components, elements, parts, sections or assembly of different levels in ascending order. However, the terms may be displaced by another expression if they achieve the same purpose.

Figure 2:
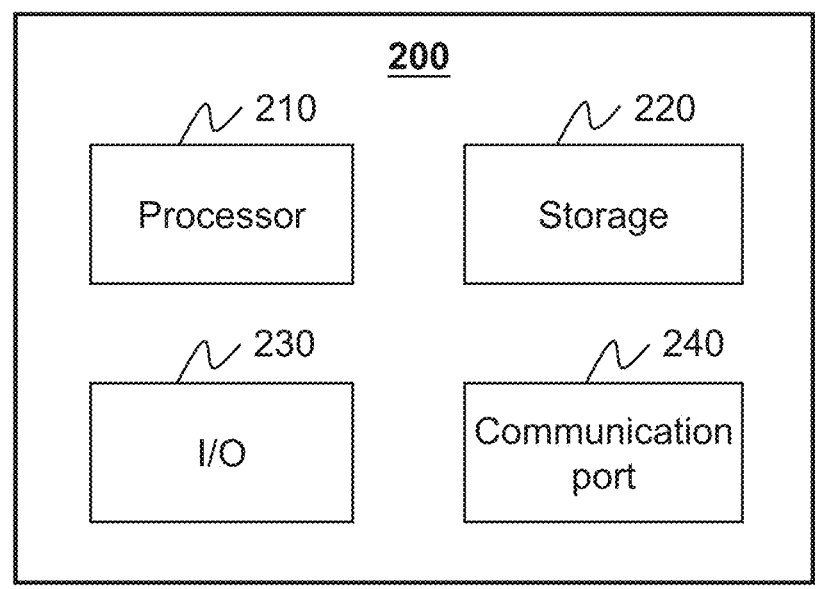
FIG. 2 is a schematic diagram illustrating exemplary hardware and/or software components of a computing device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or themselves, and/or may be invoked in response to detected events or interrupts. Software modules/units/blocks configured for execution on computing devices (e.g., processor 210 as illustrated in FIG. 2) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may apply to a system, a device, or a portion thereof.

It will be understood that when a unit, device, module or block is referred to as being "on," "connected to," or "coupled to," another unit, device, module, or block, it may be directly on, connected or coupled to, or communicate with the other unit, device, module, or block, or an intervening unit, device, module, or block may be present, unless the context clearly indicates otherwise. As used herein, the term "and/or" includes any and all combinations of one or more of the associated listed items. The term "pixel" and "voxel" in the present disclosure are used interchangeably to refer to an element in an image. The term "image" in the present disclosure is used to refer to images of various forms, including a 2-dimensional image, a 3-dimensional image, a 4-dimensional image, etc.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood the operations of the flowcharts may be implemented not in order. Conversely, the operations may be implemented in an inverted order, or simultaneously. Moreover, one or more other operations may be added to the flowcharts. One or more operations may be removed from the flowcharts.

Moreover, while the systems and methods disclosed in the present disclosure are described primarily regarding image reconstruction in an MRI system. It should be understood that this is only for illustration purposes. The systems and methods of the present disclosure may be applied to reconstruct image data acquired in different scenarios and/or for different purposes (e.g., safety monitoring, filming, or photography) and/or by different image acquisition devices (e.g., a digital camera, an analog camera, or a scanner).

For example, the systems and methods of the present disclosure may be applied to any other kind of medical imaging system. In some embodiments, the imaging system may include a single modality imaging system and/or a multi-modality imaging system. The single modality imaging system may include, for example, the MRI system. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc.

An aspect of the present disclosure relates to systems and methods for image reconstruction in MRI. The systems may obtain undersampled k-space data associated with an object (e.g., a patient). The undersampled K-space data may be generated based on magnetic resonance (MR) signals collected by an MR scanner that scans the object. The systems may also construct an ODE that formulates a reconstruction of an MR image from the undersampled k-space data. Further, the systems and methods may generate the MR image of the object by solving the ODE based on the undersampled k-space data using an ODE solver (e.g., a trained neural network model).

According to some embodiments of the present disclosure, the MR image may be reconstructed by constructing the ODE and solving the ODE using the ODE solver. Normally, image reconstruction in MRI may be an iterative process, and thereby may be represented by an ODE. Compared with a conventional discrete optimization function, the ODE may formulate the reconstruction of the MR image as a continuous function of time and model the dynamics of MR image reconstruction. This may reduce time cost and calculation cost of image reconstruction in MRI, thereby improving the efficiency and the accuracy of image reconstruction in MRI.

In addition, in certain embodiments, a neural ODE solver may be used to solve the ODE. The neural ODE solver may be trained by machine learning technique to learn an optimal mechanism for solving the ODE from training data. Optionally, an evaluation strategy of the neural ODE solver may be adapted automatically during model training, such that the neural ODE solver may reconstruct an MR image with an improved quality in a relatively short time. Moreover, the neural ODE solver may have fewer parameters than other models that directly learn the mapping between undersampled k-space data (or undersampled MR image) and fully sampled image, thereby being more suitable for mobile or edge computing devices (e.g., a self-contained computing device that is configured to receive data from the MR scanner) or a portable MRI device.

Figure 1:
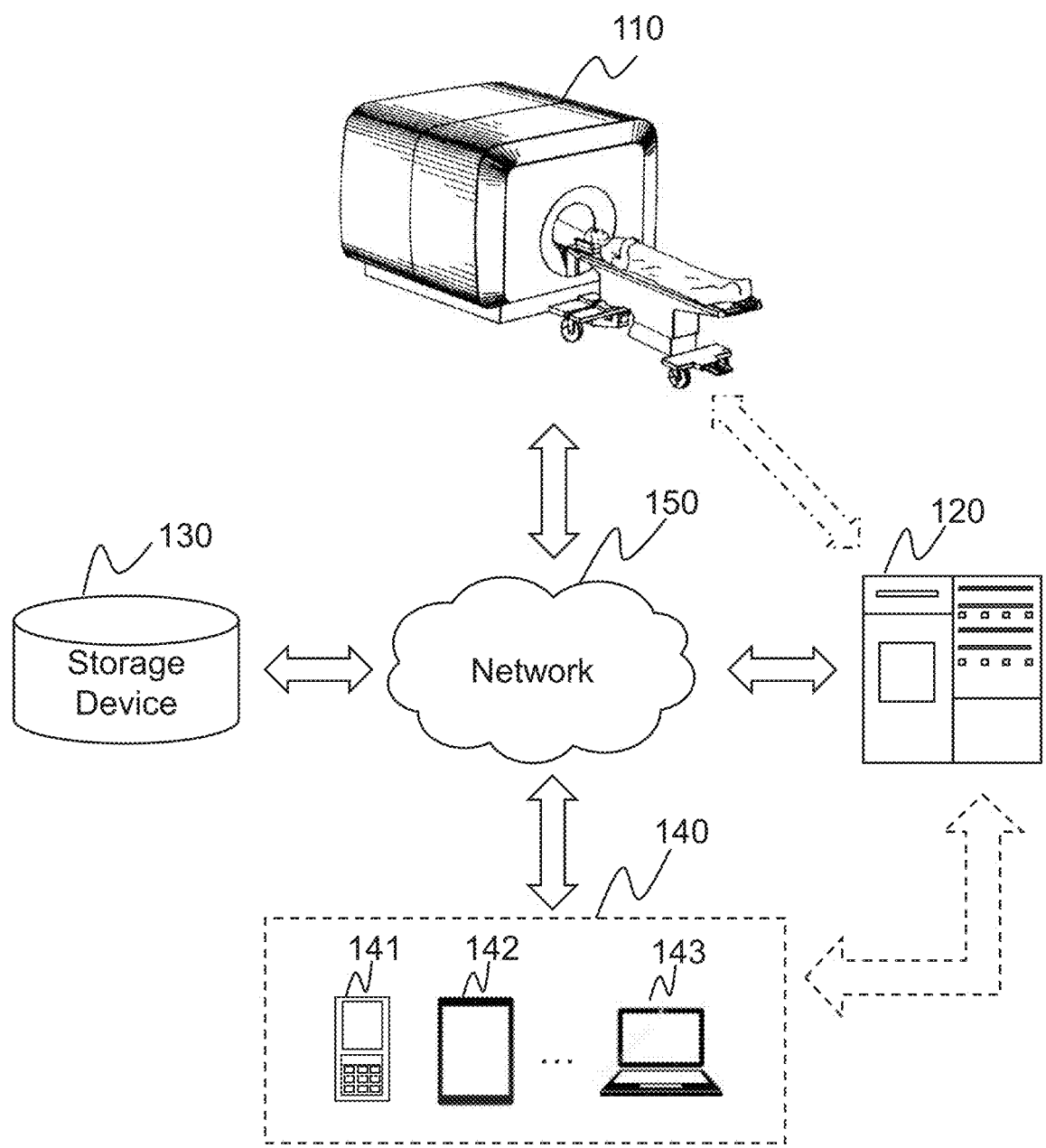
FIG. 1 is a schematic diagram illustrating an exemplary MRI system according to some embodiments of the present disclosure.

FIG. 1 is a schematic diagram illustrating an exemplary MRI system 100 according to some embodiments of the present disclosure. It should be noted that the MRI system 100 is merely provided as an exemplary imaging system, and not intended to limit the scope of the present disclosure. The exemplary methods described in the present disclosure may be applied in other imaging systems, such as a CT system, a PET system, a PET-MRI system, or the like.

As shown in FIG. 1, the MRI system 100 may include an MR scanner 110, a processing device 120, a storage device 130, one or more terminals 140, and a network 150. In some embodiments, the MR scanner 110, the processing device 120, the storage device 130, and/or the terminal(s) 140 may be connected to and/or communicate with each other via a wireless connection, a wired connection, or a combination thereof. The connections between the components in the MRI system 100 may be variable. For example, the MR scanner 110 may be connected to the processing device 120 through the network 150. As another example, the MR scanner 110 may be connected to the processing device 120 directly.

The MR scanner 110 may be configured to scan an object (or a part of the object) to acquire image data, such as MR signals associated with the object. For example, the MR scanner 110 may detect a plurality of MR signals by applying an MR pulse sequence on the object. In some embodiments, the MR scanner 110 may include, for example, a magnetic body, a gradient coil, an RF coil, etc. In some embodiments, the MR scanner 110 may be a permanent magnet MR scanner, a superconducting electromagnet MR scanner, or a resistive electromagnet MR scanner, etc., according to types of the magnetic body. In some embodiments, the MR scanner 110 may be a high-field MR scanner, a mid-field MR scanner, and a low-field MR scanner, etc., according to the intensity of the magnetic field.

In the present disclosure, "subject" and "object" are used interchangeably. The object may be biological or non-biological. For example, the object may include a patient, a man-made object, etc. As another example, the object may include a specific portion, organ, tissue, and/or a physical point of the patient. For example, the object may include head, brain, neck, body, shoulder, arm, thorax, cardiac, stomach, blood vessel, soft tissue, knee, feet, or the like, or a combination thereof.

In some embodiments, the processing device 120 may be a single server or a server group. The server group may be centralized or distributed. The processing device 120 may process data and/or information obtained from the MR scanner 110, the storage device 130, and/or the terminal(s) 140. For example, the processing device 120 may obtain undersampled k-space data associated with an object, wherein the undersampled K-space data may be generated based on MR signals collected by the MR scanner 110 during a scan of the object. The processing device 120 may reconstruct an MR image of the object by solving an ODE that formulates a reconstruction of the MR image based on the undersampled k-space data. The ODE may be solved by an ODE solver. In some embodiments, the processing device 120 may generate a trained neural network model by training a preliminary model using a plurality of training samples, wherein the trained neural network model may be used as an ODE solver (referred to as a neural ODE solver for the convenience of descriptions). Additionally or alternatively, the processing device 120 may apply the trained neural network model to solve an ODE in reconstructing an MR image.

In some embodiments, the trained neural network model may be generated by a processing device, while the application of the trained neural network model may be performed on a different processing device. In some embodiments, the trained neural network model may be generated by a processing device of a system different from the MRI system 100 or a server different from the processing device 120 on which the application of the trained neural network model is performed. For instance, the trained neural network model may be generated by a first system of a vendor who provides and/or maintains such a trained neural network model, while the reconstruction of the MR image based on the provided trained neural network model may be performed on a second system of a client of the vendor. In some embodiments, the application of the trained neural network model may be performed online in response to a request for reconstructing an MR image. In some embodiments, the trained neural network model may be determined or generated offline.

In some embodiments, the trained neural network model may be determined and/or updated (or maintained) by, e.g., the manufacturer of the MR scanner 110 or a vendor. For instance, the manufacturer or the vendor may load the trained neural network model into the MRI system 100 or a portion thereof (e.g., the processing device 120) before or during the installation of the MR scanner 110 and/or the processing device 120, and maintain or update the trained neural network model from time to time (periodically or not). The maintenance or update may be achieved by installing a program stored on a storage device (e.g., a compact disc, a USB drive, etc.) or retrieved from an external source (e.g., a server maintained by the manufacturer or vendor) via the network 150. The program may include a new model (e.g., a new trained neural network model) or a portion of a model that substitute or supplement a corresponding portion of the model.

In some embodiments, the processing device 120 may be local or remote from the MRI system 100. For example, the processing device 120 may access information and/or data from the MR scanner 110, the storage device 130, and/or the terminal(s) 140 via the network 150. As another example, the processing device 120 may be directly connected to the MR scanner 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be implemented by a computing device 200 having one or more components as described in connection with FIG. 2.

The storage device 130 may store data, instructions, and/or any other information. In some embodiments, the storage device 130 may store data obtained from the MR scanner 110, the processing device 120, and/or the terminal(s) 140. In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or a combination thereof. Exemplary mass storage devices may include a magnetic disk, an optical disk, a solid-state drive, etc. Exemplary removable storage devices may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), a digital versatile disk ROM, etc. In some embodiments, the storage device 130 may be implemented on a cloud platform as described elsewhere in the disclosure.

In some embodiments, the storage device 130 may be connected to the network 150 to communicate with one or more other components in the MRI system 100 (e.g., the MR scanner 110, the processing device 120, and/or the terminal(s) 140). One or more components of the MRI system 100 may access the data or instructions stored in the storage device 130 via the network 150. In some embodiments, the storage device 130 may be part of the processing device 120 or the terminal(s) 140.

The terminal(s) 140 may be configured to enable a user interaction between a user and the MRI system 100. For example, the terminal(s) 140 may receive an instruction to cause the MR scanner 110 to scan the object from the user. As another example, the terminal(s) 140 may receive a processing result (e.g., a reconstructed MR image relating to the object) from the processing device 120 and display the processing result to the user. In some embodiments, the terminal(s) 140 may be connected to and/or communicate with the MR scanner 110, the processing device 120, and/or the storage device 130. In some embodiments, the terminal(s) 140 may include a mobile device 140-1, a tablet computer 140-2, a laptop computer 140-3, or the like, or a combination thereof. For example, the mobile device 140-1 may include a mobile phone, a personal digital assistant (PDA), a gaming device, a navigation device, a point of sale (POS) device, a laptop, a tablet computer, a desktop, or the like, or a combination thereof. In some embodiments, the terminal(s) 140 may include an input device, an output device, etc. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to the processing device 120 via, for example, a bus, for further processing. Other types of the input device may include a cursor control device, such as a mouse, a trackball, or cursor direction keys, etc. The output device may include a display, a speaker, a printer, or the like, or a combination thereof. In some embodiments, the terminal(s) 140 may be part of the processing device 120 or the MR scanner 110.

The network 150 may include any suitable network that can facilitate the exchange of information and/or data for the MRI system 100. In some embodiments, one or more components of the MRI system 100 (e.g., the MR scanner 110, the processing device 120, the storage device 130, the terminal(s) 140, etc.) may communicate information and/or data with one or more other components of the MRI system 100 via the network 150. For example, the processing device 120 may obtain image data (e.g., MR signals) from the MR scanner 110 via the network 150. As another example, the processing device 120 may obtain user instructions from the terminal(s) 140 via the network 150.

The network 150 may include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, or the like, or a combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or a combination thereof. In some embodiments, the network 150 may include one or more network access points. For example, the network 150 may include wired and/or wireless network access points such as base stations and/or internet exchange points through which one or more components of the MRI system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MR scanner 110. As another example, a component of the MRI system 100 may be replaced by another component that can implement the functions of the component. In some embodiments, the storage device 130 may be a data storage including cloud computing platforms, such as a public cloud, a private cloud, a community, and hybrid cloud, etc. However, those variations and modifications do not depart the scope of the present disclosure.

FIG. 2 is a schematic diagram illustrating exemplary hardware and/or software components of a computing device 200 according to some embodiments of the present disclosure. The computing device 200 may be used to implement any component of the MRI system 100 as described herein. For example, the processing device 120 and/or a terminal 140 may be implemented on the computing device 200, respectively, via its hardware, software program, firmware, or a combination thereof. Although only one such computing device is shown, for convenience, the computer functions relating to the MRI system 100 as described herein may be implemented in a distributed fashion on a number of similar platforms, to distribute the processing load. As illustrated in FIG. 2, the computing device 200 may include a processor 210, a storage 220, an input/output (I/O) 230, and a communication port 240.

The processor 210 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 210 may process image data of an object obtained from the MR scanner 110, the storage device 130, terminal(s) 140, and/or any other component of the MRI system 100. As another example, the processor 210 may generate an MR image of the object based on the objected image data of the object.

In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or a combinations thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both operation A and operation B, it should be understood that operation A and operation B may also be performed by two or more different processors jointly or separately in the computing device 200 (e.g., a first processor executes operation A and a second processor executes operation B, or the first and second processors jointly execute operations A and B).

The storage 220 may store data/information obtained from the MR scanner 110, the storage device 130, the terminal(s) 140, and/or any other component of the MRI system 100. In some embodiments, the storage 220 may include a mass storage device, a removable storage device, a volatile read-and-write memory, a read-only memory (ROM), or the like, or a combination thereof. In some embodiments, the storage 220 may store one or more programs and/or instructions to perform exemplary methods described in the present disclosure. For example, the storage 220 may store a program for the processing device 120 to execute to generate a trained neural network model (e.g., a neural ODE solver). As another example, the storage 220 may store a program for the processing device 120 to execute to apply the trained neural network model to solve an ODE in image reconstruction.

The I/O 230 may input and/or output signals, data, information, etc. In some embodiments, the I/O 230 may enable a user interaction with the processing device 120. In some embodiments, the I/O 230 may include an input device and an output device. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to another component (e.g., the processing device 120) via, for example, a bus, for further processing. Other types of the input device may include a cursor control device, such as a mouse, a trackball, or cursor direction keys, etc. The output device may include a display (e.g., a liquid crystal display (LCD), a light-emitting diode (LED)-based display, a flat panel display, a curved screen, a television device, a cathode ray tube (CRT), a touch screen), a speaker, a printer, or the like, or a combination thereof.

The communication port 240 may be connected to a network (e.g., the network 150) to facilitate data communications. The communication port 240 may establish connections between the processing device 120 and one or more components of the MRI system 100 (e.g., the MR scanner 110, the storage device 130, and/or the terminal(s) 140). The connection may be a wired connection, a wireless connection, any other communication connection that can enable data transmission and/or reception, and/or a combination of these connections. The wired connection may include, for example, an electrical cable, an optical cable, a telephone wire, or the like, or a combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or a combination thereof. In some embodiments, the communication port 240 may be and/or include a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
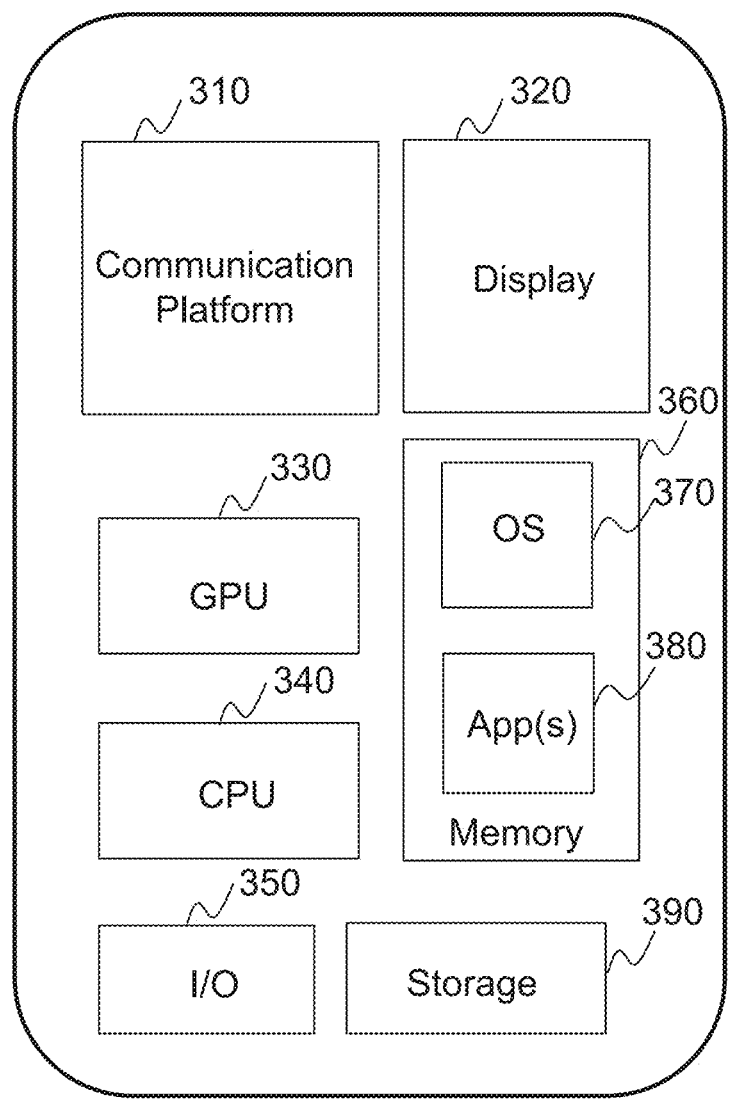
FIG. 3 is a schematic diagram illustrating exemplary hardware and/or software components of a mobile device according to some embodiments of the present disclosure.

FIG. 3 is a schematic diagram illustrating exemplary hardware and/or software components of a mobile device 300 according to some embodiments of the present disclosure. In some embodiments, one or more components of the MRI system 100 may be implemented on one or more components of the mobile device 300. Merely by way of example, a terminal 140 may be implemented on one or more components of the mobile device 300.

As illustrated in FIG. 3, the mobile device 300 may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS™, Android™, Windows Phone™, etc.) and one or more applications 380 may be loaded into the memory 360 from the storage 390 in order to be executed by the CPU 340. The applications 380 may include a browser or any other suitable mobile apps for receiving and rendering information relating to the MRI system 100. User interactions with the information stream may be achieved via the I/O 350 and provided to the processing device 120 and/or other components of the MRI system 100 via the network 150.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal device. A computer may also act as a server if appropriately programmed.

Figure 4A:
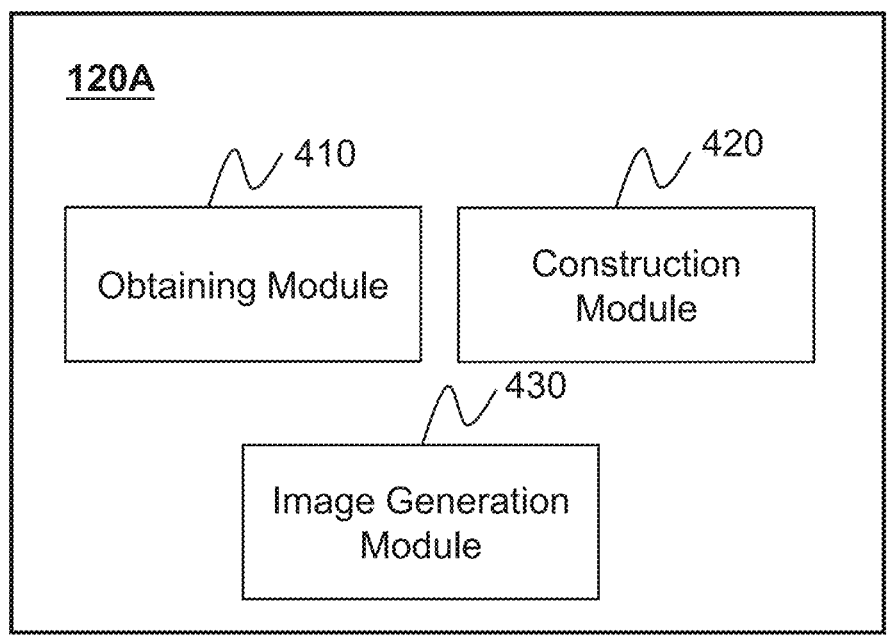
FIGS. 4A and 4B are block diagrams illustrating exemplary processing devices according to some embodiments of the present disclosure.
Figure 4B:
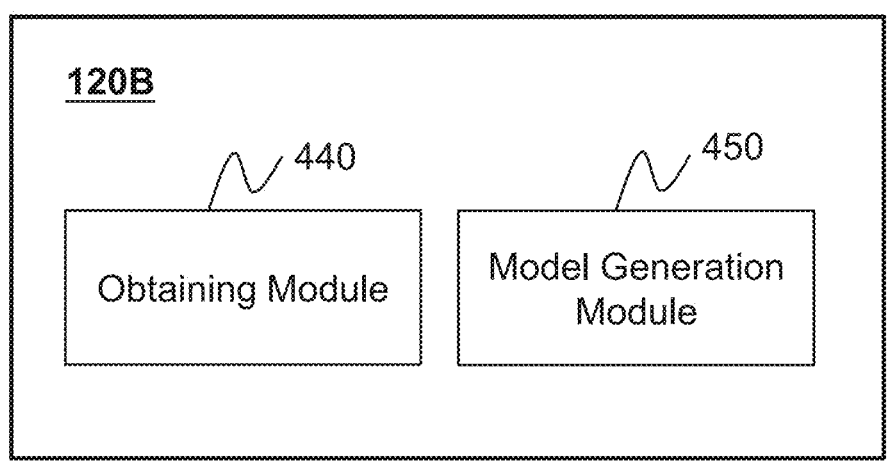

FIGS. 4A and 4B are block diagrams illustrating exemplary processing devices according to some embodiments of the present disclosure. The processing devices 120A and 120B may be exemplary embodiments of the processing device 120 as described in connection with FIG. 1. In some embodiments, the processing device 120A may be configured to reconstruct an MR image of an object based on image data collected in an MR scan of the object. For example, the processing device 120A may reconstruct the MR image of the object by applying a trained neural network model to solve an ODE that formulates the reconstruction of the MR image. The processing device 120B may be configured to obtain a plurality of training samples and/or generate the trained neural network model using the training samples. In some embodiments, the processing devices 120A and 120B may be respectively implemented on a processing unit (e.g., a processor 210 illustrated in FIG. 2 or a CPU 340 as illustrated in FIG. 3). Merely by way of example, the processing devices 120A may be implemented on a CPU 340 of a terminal device, and the processing device 120B may be implemented on a computing device 200. Alternatively, the processing devices 120A and 120B may be implemented on a same computing device 200 or a same CPU 340. For example, the processing devices 120A and 120B may be implemented on a same computing device 200.

As shown in FIG. 4A, the processing device 120A may include an obtaining module 410, a construction module 420, and an image generation module 430.

The obtaining module 410 may be configured to obtain undersampled k-space data associated with the object. The undersampled K-space data may be generated based on MR signals collected by an MR scanner (e.g., the MR scanner 110) that scans the object. More descriptions regarding the obtaining of the undersampled k-space data associated with the object may be found elsewhere in the present disclosure. See, e.g., operation 510 in FIG. 5 and relevant descriptions thereof.

The construction module 420 may be configured to construct an ODE that formulates the reconstruction of the MR image based on the undersampled k-space data. In some embodiments, the construction module 420 may formulate the reconstruction of the MR image based on the undersampled k-space data into a discrete optimization process. Further, the construction module 420 may construct the ODE by transforming the discrete optimization process into a continuous optimization process. More descriptions regarding the construction of the ODE may be found elsewhere in the present disclosure. See, e.g., operation 520 in FIG. 5 and relevant descriptions thereof.

The image generation module 430 may be configured to generate the MR image of the object by solving the ODE based on the undersampled k-space data using an ODE solver. In some embodiments, the image generation module 430 may reconstruct an undersampled MR image of the object based on the undersampled k-space data, wherein the undersampled MR image may serve as an initial value of the ODE. In some alternative embodiments, the image generation module 430 may designate the undersampled k-space data or a combination of the undersampled k-space data and the undersampled MR image as the initial value of the ODE. In certain embodiments, the ODE solver may be a trained neural network model, such as a convolutional neural network (CNN) model, a recurrent neural network (RNN) model (e.g., a bi-directional RNN model), a cascaded neural network model, or the like, or any combination thereof. The image generation module 430 may input the initial value of the ODE into the trained neural network model, and determine the MR image of the object based on an output of the trained neural network model. More descriptions regarding the generation of the MR image of the object may be found elsewhere in the present disclosure. See, e.g., operation 530 in FIG. 5 and relevant descriptions thereof.

As shown in FIG. 4B, the processing device 120B may include an obtaining module 440, and a model generation module 450.

The obtaining module 440 may be configured to obtain a plurality of training samples. In some embodiments, a training sample may include a training undersampled MR image and a corresponding ground truth MR image of a training object. Optionally, the training sample may also include undersampled k-space data and full k-space data of the training object. More descriptions regarding the obtaining of the plurality of training samples may be found elsewhere in the present disclosure. See, e.g., operation 610 in FIG. 6 and relevant descriptions thereof.

The obtaining module 440 may be further configured to obtain a preliminary model having one or more model parameters. The preliminary model may be of any type of neural network model. In certain embodiments, the preliminary model may include a Convolutional Neural Network (CNN) model (e.g., a full CNN model, a Le network (LeNet) model, an Alex network (AlexNet) model, a Visual Geometry Group network (VGGNet) model), an RNN model (e.g., a bi-directional RNN model, an Elman Neural Network model, a Jordan Neural Network model), or a cascaded neural network model, or the like, or any combination thereof. More descriptions regarding the obtaining of the preliminary model may be found elsewhere in the present disclosure. See, e.g., operation 620 in FIG. 6 and relevant descriptions thereof.

The model generation module 450 may be configured to generate the trained neural network model by iteratively updating values of the one or more model parameters of the preliminary model based on the plurality of training samples. In some embodiments, the model generation module 450 may update the model parameter(s) of the preliminary model by performing one or more iterations. More descriptions regarding the generation of the trained neural network model may be found elsewhere in the present disclosure. See, e.g., operation 630 in FIG. 6 and relevant descriptions thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the processing device 120A and/or the processing device 120B may share two or more of the modules, and any one of the modules may be divided into two or more units. For instance, the processing devices 120A and 120B may share a same obtaining module; that is, the obtaining module 410 and the obtaining module 440 are a same module. In some embodiments, the processing device 120A and/or the processing device 120B may include one or more additional modules, such as a storage module (not shown) for storing data. In some embodiments, the processing device 120A and the processing device 120B may be integrated into one processing device 120.

FIG. 5 is a flowchart illustrating an exemplary process for reconstructing an MR image of an object according to some embodiments of the present disclosure. In some embodiments, process 500 may be executed by the MRI system 100. For example, the process 500 may be implemented as a set of instructions (e.g., an application) stored in a storage device (e.g., the storage device 130, the storage 220, and/or the storage 390). In some embodiments, the processing device 120A (e.g., the processor 210 of the computing device 200, the CPU 340 of the mobile device 300, and/or one or more modules illustrated in FIG. 4A) may execute the set of instructions and may accordingly be directed to perform the process 500.

In 510, the processing device 120A (e.g., the obtaining module 410, the interface circuits of the processor 210) may obtain undersampled k-space data associated with the object. The undersampled K-space data may be generated based on MR signals collected by an MR scanner (e.g., the MR scanner 110) that scans the object.

As used herein, the object may include a biological object and/or a non-biological object, such as a patient or a specific portion (e.g., an organ or a tissue) of the patient. Merely by way of example, the object may include at least a portion of the heart of a patient, and the process 500 may be performed in cardiac cine image reconstruction. Normally, full k-space data of the object may need to be collected for reconstructing a full MR image of the object. In order to accelerate the data acquisition and reduce the scan time, a fraction of the full k-space data (i.e., the undersampled k-space data) may be acquired by undersampling with, for example, a reduced number of k-space sample steps, a reduced number of samples per line, a reduced number of lines per blade, a reduced number of blades per acquisition, or the like, or any combination thereof. Optionally, one or more other imaging approaches, such as parallel imaging may be utilized in combination with undersampling in the MR scan of the object to further speed up the MR scan.

In some embodiments, the processing device 120A may obtain the MR signals from the MR scanner 110, and generate the undersampled k-space data by filling the MR signals into K-space. Alternatively, the undersampled k-space data may be previously generated by a computing device (e.g., the processing device 120A or another processor) and stored in a storage device (e.g., the storage device 130, the storage 220, an external storage device). The processing device 120A may retrieve the undersampled k-space data from the storage device.

In 520, the processing device 120A (e.g., the construction module 420, the processing circuits of the processor 210) may construct an ODE that formulates the reconstruction of the MR image based on the undersampled k-space data.

In some embodiments, the processing device 120A may formulate the reconstruction of the MR image based on the undersampled k-space data into a discrete optimization process. For example, the reconstruction of the MR image based on the undersampled k-space data may be formulated as Equation (1) as below:

$$y = Fx + \epsilon, \quad (1)$$

where x refers to the MR image to be reconstructed (or referred to as a "solution" of Equation (1)), y refers to the undersampled k-space data associated with the object, $\epsilon$ refers to an error in the reconstruction of the MR image, and F refers to one or more measurement operations (e.g., a Fourier transformation) that transforms an image into k-space data. The goal of MRI image reconstruction may be that Fx is close to the undersampled k-space data y.

In some embodiments, because that information included in the undersampled k-space data y may be less than information included in the MR image x to be reconstructed, Equation (1) may have multiple solutions. In order to solve the Equation (1), Equation (1) may be transformed into an optimization function as indicated by Equation (2) as below:

$$\operatorname*{argmin}_{x} \frac{1}{2} \|y - Fx\|_2^2 + \lambda R(x), \quad (2)$$

where $\|y-Fx\|_2^2$ refers to a data fidelity term, R(x) refers to a regularization term, and $\lambda$ refers to a weighting coefficient of R(x). In certain embodiments, the regularization term R(x) may include one or more possible values of x. For example, the regularization term R(x) may reflect a probability distribution of x, which may include possible values of x and a probability of each possible value. The weighting coefficient $\lambda$ may be a default setting (e.g., an experience value) of the MRI system 100, set manually by a user, or adjusted by processing device 120A according to an actual need. For example, the weighting coefficient $\lambda$ may induce a punishment into Equation (2) if the difference of the value of x and its possible value(s) defined by the regularization term R(x) is greater than a threshold difference. In some embodiments, $\lambda$ may be a parameter of a neural ODE solver as described elsewhere in this disclosure (e.g., FIG. 8 and the relevant descriptions). The value of the weighting coefficient $\lambda$ may be determined in generating the neural ODE solver by model training.

Assuming that the regularization term R(x) is differentiable, the optimization function of Equation (2) may be solved in an iterative fashion by performing K iterations (K being any positive integer). For example, by using a gradient decent algorithm, an MR image $\hat{x}^k$ obtained in a $k^{th}$ iteration may be updated in a $(k+1)^{th}$ iteration according to Equation (3) as below:

$$\hat{x}^{(k+1)} = \hat{x}^k + \alpha[F^T(y - F\hat{x}^k) + \nabla R(\hat{x}^k)], \quad (3)$$

where $\hat{x}^{(k+1)}$ refers to an MR image generated in the $(k+1)^{th}$ iteration (i.e., an updated image of the MR image $\hat{x}^k$), $\alpha$ refers to a learning rate (or referred to as a stride), and $F^T(y - F\hat{x}^k) + \nabla R(\hat{x}^k)$ may be determined by take a derivative of Equation (2).

According to Equation (3), $\alpha[F^T(y-F\hat{x}^k)+\nabla R(\hat{x}^k)]$ may be added to the MR image $\hat{x}^k$ in order to generate the MR image $\hat{x}^{(k+1)}$, wherein the difference between $\hat{x}^k$ and $\hat{x}^{(k+1)}$ may be associated with the learning rate $\alpha$. For example, the smaller the learning rate $\alpha$ is, the smaller difference between $\hat{x}^k$ and $\hat{x}^{(k+1)}$ is, and the more iterations may need to be performed in reconstructing of the MR image. In certain embodiments, the learning rate may be a default setting (e.g., an experience value) of the MRI system 100, set manually by a user, or adjusted by processing device 120A according to an actual need. In some embodiments, the learning rate may be a parameter of a neural ODE solver as described elsewhere in this disclosure (e.g., FIG. 8 and the relevant descriptions). The value of the learning rate may be determined in generating the neural ODE solver by model training.

Equation (3) may then be transformed into Equation (4) as below:

$$\hat{x}^{(k+1)} - \hat{x}^k = \alpha[F^T(y - F\hat{x}^k) + \nabla R(\hat{x}^k)], \quad (4)$$

where $\hat{x}^{(k+1)} - \hat{x}^k$ refers to the difference between the MR images $\hat{x}^k$ and $\hat{x}^{(k+1)}$ of two adjacent iterations. Equation (4) may model how the reconstructed MR image changes during the K iterations. The change of reconstructed MR image is described in discrete states defined by the number of iterations K, thereby the reconstruction of the MR image as defined by Equations (1) to (4) may be regarded as a discrete optimization process.

The processing device 120 may further construct the ODE by transforming the discrete optimization process into a continuous optimization process. For example, Equation (4) may be transformed into Equation (5) as below:

$$\hat{x}^{(k+1)} - \hat{x}^k = f(\hat{x}^k, y, \theta), \quad (5)$$

where $\theta$ refers to one or more parameters other than $\hat{x}^k$ and y. If the optimization process is regarded as a continuous optimization process in the continuous time t, Equation (5) may be transformed into Equation (6) as below:

$$\frac{d\hat{x}(t)}{dt} = f(\hat{x}(t), t, y, \theta), \quad (6)$$

where t refers to time, $\hat{x}(t)$ refers to an MR image (also referred to as a solution of Equation (6)) at time t, and $f(\hat{x}(t),t,y,\theta)$ may be a function representing the difference between the MR images $\hat{x}^k$ and $\hat{x}^{(k+1)}$ of two adjacent iterations. Equation (6) may be an ODE that models a rate of change of the reconstructed MR image over the time t during the continuous optimization process. According to the Equation (6), the MR image may be reconstructed directly based on an MR image $\hat{x}(0)$ (also referred to as an initial value of Equation (6)), which reduces the time cost and calculation cost of the MR image reconstruction, thereby improving the efficiency and the accuracy of the MR image reconstruction in MRI.

In 530, the processing device 120A (e.g., the image generation module 430, the processing circuits of the processor 210) may generate the MR image of the object by solving the ODE (e.g., the Equation (6)) based on the undersampled k-space data using an ODE solver.

As used herein, an ODE solver refers to an algorithm or a model that can be used to solve an ODE. For example, the ODE solver may include a non-trainable ODE solver (e.g., a Euler's algorithm, a midpoint algorithm, or a Runge-Kutta (RK) algorithm), a neural ODE solver (i.e., a trained neural network model), or the like, or any combination thereof.

In some embodiments, the processing device 120A may reconstruct an undersampled MR image of the object based on the undersampled k-space data, wherein the undersampled MR image may serve as an initial value of the ODE. For example, the processing device 120A may reconstruct the undersampled MR image of the object by performing an Inverse Fourier transform (IFT) on the undersampled k-space data. In some alternative embodiments, the processing device 120A may designate the undersampled k-space data or a combination of the undersampled k-space data and the undersampled MR image as the initial value of the ODE.

In certain embodiments, the ODE solver may be a trained neural network model, such as a convolutional neural network (CNN) model, a recurrent neural network (RNN) model (e.g., a bi-directional RNN model), a cascaded neural network model, or the like, or any combination thereof. The processing device 120A may input the initial value of the ODE into the trained neural network model, and determine the MR image of the object based on an output of the trained neural network model. For example, the processing device 120A may input the undersampled MR image into the trained neural network model, and the trained neural network model may output the MR image. As another example, the processing device 120A may input the undersampled k-space data into the trained neural network model, and the trained neural network model may output the MR image. As a further example, the processing device 120A may input the undersampled k-space data and the undersampled MR image into the trained neural network model, and the trained neural network model may output the MR image. As a still further example, the processing device 120A may input the undersampled k-space data into the trained neural network model, and the trained neural network model may output full k-space data of the object. Further, the processing device 120A may obtain the MR image of the object by performing an inverse Fourier transformation (IFFT) on the full k-space data. In some embodiments, the input of the trained neural network model may include the initial value of the ODE and also an time index. The time index may be in a predetermined range, for example, [0, 1], [0, 10], or the like.

For illustration purposes, the following descriptions regarding the trained neural network model take the undersampled MR image as an exemplary input of the trained neural network model (i.e., an exemplary initial value of the ODE), and the MR image as an exemplary output of the trained neural network model. This is not intended to be limiting, and the input and output of the trained neural network model may be of any other suitable form.

In some embodiments, the structure of the trained neural network model may be determined based on a non-trainable ODE solver, such as an RK algorithm. More descriptions regarding the determination of the structure of the trained neural network based on a non-trainable ODE solver may be found elsewhere in the present disclosure. See, e.g., operation 620 and relevant descriptions thereof.

In some embodiments, the trained neural network model may be a cascade neural network model including a plurality of sequentially connected sub-models. The plurality of sequentially connected sub-models may include a first sub-model and one or more second sub-models downstream to the first sub-model. The input of the first sub-model may include the initial value of the ODE. The input of each second sub-model may include an output of a previous sub-model connected to the second sub-model. The output of the last second sub-model of the cascade neural network model may be the MR image. In certain embodiments, at least one of the sub-models of the cascade neural network model may include a convolutional model (e.g., a CNN) and a data consistency (DC) layer connected to the convolutional model. More descriptions regarding the cascade neural network model may be found elsewhere in the present disclosure. See, e.g., FIG. 8 and relevant descriptions thereof.

In some alternative embodiments, the trained neural network model may be an RNN model (e.g., a bi-directional RNN) including a plurality of sequentially RNN cells (which may be regarded as a plurality of sub-models). The plurality of RNN cells may include a first RNN cell and one or more second RNN cells. The input of the first RNN cell may include the initial value of the ODE. The input of each second RNN cell may include an output of a previous RNN cell connected to the second RNN cell. The output of the last second RNN cell of the RNN model may be the MR image. In certain embodiments, the RNN cells may include a vanilla RNN, a Gated Recurrent Unit (GRU) cell, a Long Short-Term Memory (LSTM) cell, or the like, or any combination thereof. Additionally or alternatively, a matrix multiplication in at least one RNN cell of the RNN model may be replaced by one or more convolutional kernels (e.g., a 3×3 kernel, a 5×5 kernel, a 7×7 kernel). Optionally, the at least one RNN cell may further include a DC layer connected to the one or more convolutional kernels.

The cascade neural network model or the RNN model may simulate the continuous optimization process in reconstructing the MR image as described in connection with 520. Taking the cascade neural network model for example, the initial value of the ODE may be updated (i.e., optimized) by the plurality of sub-models sequentially. The count and parameters of the sub-models may be determined in generating the cascade neural network model by model training. The updating of the initial value of the ODE by the sub-models may be regarded as a continuous optimization process if the count of the sub-models (or the count of layers of the sub-models) is greater than a threshold number. Compared with other ODE solvers, using a neural ODE solver may improve the reconstruction accuracy and efficiency by utilizing an adaptive elevation strategy and/or reducing, e.g., the processing time, the computational complexity and/or cost, etc.

In some embodiments, the trained neural network model may be obtained from one or more components of the MRI system 100 or an external source via a network (e.g., the network 150). For example, the trained neural network model may be previously trained by a computing device (e.g., the processing device 120B), and stored in a storage device (e.g., the storage device 130, the storage 220, and/or the storage 390) of the MRI system 100. The processing device 120A may access the storage device and retrieve the trained neural network model. In some embodiments, the trained neural network model may be generated according to a machine learning algorithm. The machine learning algorithm may include but not be limited to an artificial neural network algorithm, a deep learning algorithm, a decision tree algorithm, an association rule algorithm, an inductive logic programming algorithm, a support vector machine algorithm, a clustering algorithm, a Bayesian network algorithm, a reinforcement learning algorithm, a representation learning algorithm, a similarity and metric learning algorithm, a sparse dictionary learning algorithm, a genetic algorithm, a rule-based machine learning algorithm, or the like, or any combination thereof. In some embodiments, the trained neural network model may be trained by a computing device (e.g., the processing device 120B or an external processing device) by performing one or more operations of process 600 as described in connection with FIG. 6.

In some embodiments, the processing device 120A may further process the generated MR image of the object to generate a final MR image of the object. For example, in solving the ODE using the ODE solver, a plurality of intermediate MR images may be generated. Merely by way of example, the Euler's algorithm or the trained neural network model as aforementioned may iteratively update the initial value (e.g., the undersampled MR image), during which a plurality of intermediate MR images may be generated. In order to improve the image quality, the processing device 120A may perform an extrapolation on the generated MR image of the object based on the intermediate MR images to obtain a final MR image of the object. More descriptions regarding the extrapolation may be found elsewhere in the present disclosure. See, e.g., FIG. 9 and relevant descriptions thereof.

In some embodiments, the iterative updating of the initial value (e.g., the undersampled MR image) performed by the ODE solver may be regarded as a plurality of evaluations performed on the initial value. An error bound associated with the evaluations may be set before solving the ODE to specify the count of evaluations performed in solving the ODE. The smaller the error bound, the more evaluations may need to be performed, and the more accurate the reconstructed image may be. However, the generation of the MR image may cost more time if more evaluations are performed. It is desirable that the error bound has a suitable value so that an MR image with an improved quality may be reconstructed in a relatively short time. The value of the error bound may be a default setting of the MRI system 100, set manually by a user according to experience, or determined by the processing device 120A (or another computing device, such as the processing device 120B) according to an actual need. In certain embodiments, the ODE solver may be a trained neural network model. The value of the bound error may be set by setting a predetermined threshold value of a loss function in training the trained neural network model. The count of the evaluations and/or the time to perform each evaluation may be determined automatically in model training. This may improve the efficiency and accuracy of the reconstruction of the MR image.

It should be noted that the above description regarding the process 500 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 500 may be accomplished with one or more additional operations not described and/or without one or more of the operations discussed above. For example, the process 500 may include an additional operation to transmit the generated MR image of the object to a terminal device (e.g., a terminal 140 of a doctor) for display. Additionally, the order of the operations of process 500 illustrated in FIG. 5 and described below is not intended to be limiting. Moreover, the process 500 may be used to generate any other type of images that can be reconstructed by an iterative optimization process, such as an X-ray image, a computed tomography (CT) image, a positron emission tomography (PET) image, or the like, or any combination thereof.

FIG. 6 is a flowchart illustrating an exemplary process for generating a trained neural network model according to some embodiment of the present disclosure. In some embodiments, process 600 may be executed by the MRI system 100. For example, the process 600 may be implemented as a set of instructions (e.g., an application) stored in a storage device (e.g., the storage device 130, the storage 220, and/or the storage 390). In some embodiments, the processing device 120B (e.g., the processor 210 of the computing device 200, the CPU 340 of the mobile device 300, and/or one or more modules illustrated in FIG. 4B) may execute the set of instructions and may accordingly be directed to perform the process 600. Alternatively, the process 600 may be performed by a computing device of a system of a vendor that provides and/or maintains such a trained neural network model, wherein the system of the vendor is different from the MRI system 100. For illustration purposes, the following descriptions are described with reference to the implementation of the process 600 by the processing device 120B, and not intended to limit the scope of the present disclosure.

In 610, the processing device 120B (e.g., the obtaining module 440, the interface circuits of the processor 210) may obtain a plurality of training samples.

In some embodiments, a training sample may include a training undersampled MR image and a corresponding ground truth MR image of a training object. As used herein, the training undersampled MR image refers to an undersampled MR image of the training object that is of the same type of object as the object as described in connection with FIG. 5. The ground truth MR image of the training object refers to a full MR image of the training object that is reconstructed from full k-space data of the training object. For example, if the trained neural network model is used to reconstruct a cardiac MR image of a patient, the ground truth MR image may be a full cardiac MR image of another patient that is reconstructed based on full k-space data relating to the heart of the other patient. Optionally, the training sample may also include undersampled k-space data and full k-space data of the training object.

In some embodiments, a training sample of a training object may be previously generated and stored in a storage device (e.g., the storage device 130, the storage 220, the storage 390, or an external database). The processing device 120B may retrieve the training sample directly from the storage device. In some alternative embodiments, at least a portion of the training sample may be generated by the processing device 120B. Merely by way of example, the processing device 120B may obtain full k-space data of the training object, and generate the training undersampled MR image and the ground truth MR image of the training object based on the full k-space data of the training object.

Figure 7:
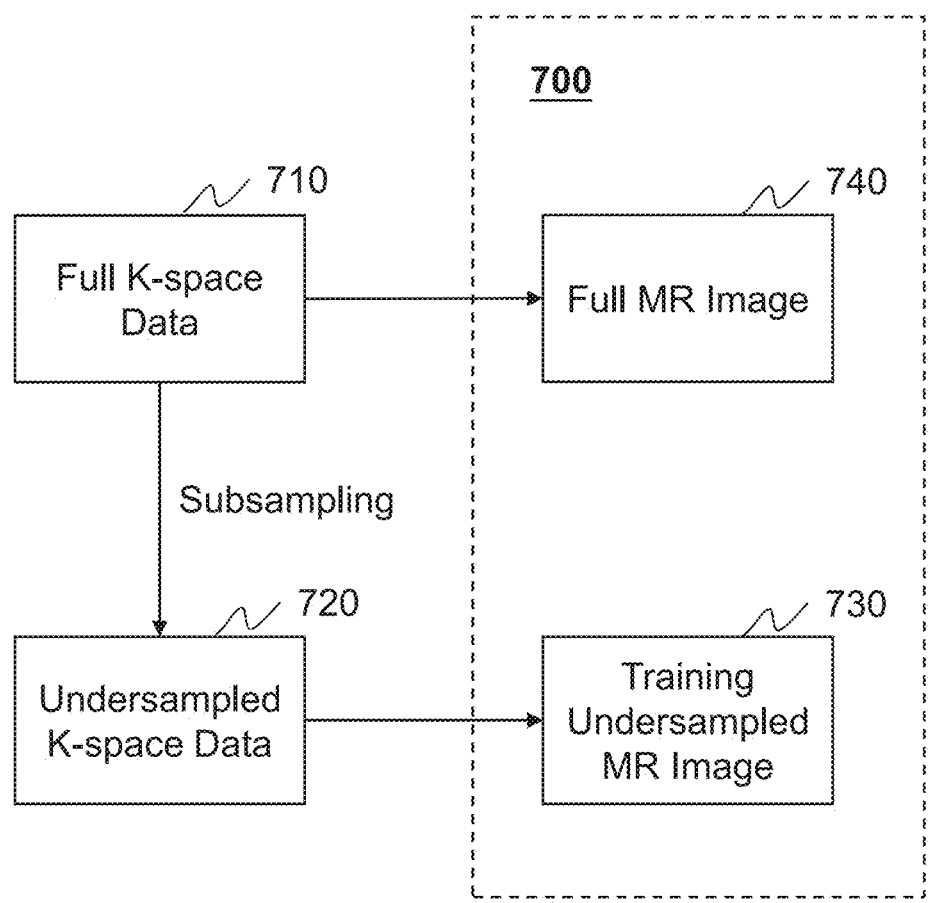
FIG. 7 is a schematic diagram illustrating an exemplary process of generating a training sample of a training object according to some embodiments of the present disclosure.

For illustration purposes, FIG. 7 illustrates an exemplary process of generating a training sample 700 of a training object according to some embodiments of the present disclosure. As illustrated in FIG. 7, the processing device 120B may obtain full k-space data 710 of the training object from, for example, the storage device 130 or the MR scanner 110. According to the full k-space data 710 and an MR image reconstruction algorithm (e.g., an IFFT algorithm), the processing device 120B may reconstruct a full MR image 740 as a ground truth MR image of the training object. The processing device 120B may also generate undersampled k-space data 720 of the training object by subsampling the full k-space data 710. Further, the processing device 120B may reconstruct a training undersampled MR image 730 of the training object based on the undersampled k-space data 720. For example, an IFFT may be performed on the undersampled k-space data 720 to generate the training undersampled MR image 730. Optionally, a zero-padding operation may be performed on the undersampled k-space data 720 during the IFFT in order to improve the resolution of the reconstructed training undersampled MR image 730. The training undersampled MR image 730 and the ground truth MR image 740 may form the training sample 700 of the training object. Optionally, the training sample 700 may further include the undersampled k-space data 720 and/or the full k-space data 710 of the training object.

In 620, the processing device 120B (e.g., the obtaining module 440, the interface circuits of the processor 210) may obtain a preliminary model having one or more model parameters.

Figure 8:
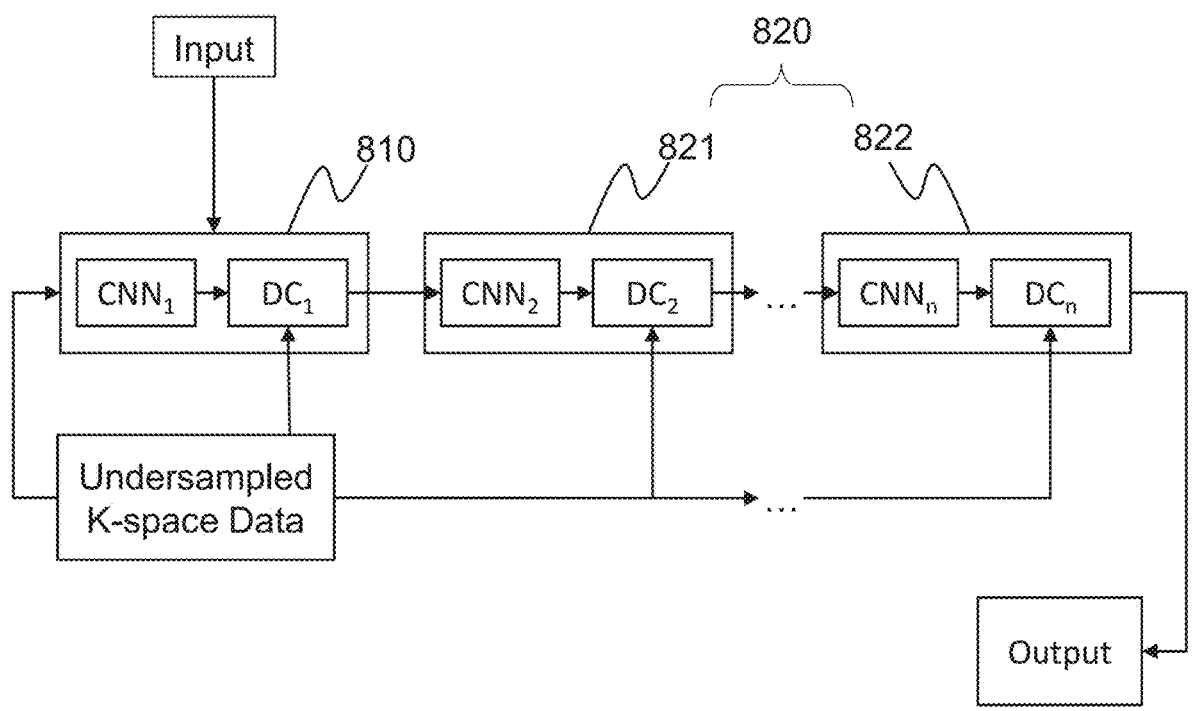
FIG. 8 is a schematic diagram illustrating an exemplary cascade neural network model according to some embodiments of the present disclosure.

The preliminary model may be of any type of neural network model. In certain embodiments, the preliminary model may include a Convolutional Neural Network (CNN) model (e.g., a full CNN model, a Le network (LeNet) model, an Alex network (AlexNet) model, a Visual Geometry Group network (VGGNet) model), an RNN model (e.g., a bi-directional RNN model, an Elman Neural Network model, a Jordan Neural Network model), or a cascaded neural network model, or the like, or any combination thereof. For example, the preliminary model may have a same or similar configuration as the cascade neural network model 800 as shown in FIG. 8. In some embodiments, the preliminary model may include one or more model parameters. For example, the preliminary model may be a CNN model and exemplary model parameters of the preliminary model may include the number (or count) of layers, the number (or count) of kernels, a kernel size, a stride, a padding of each convolutional layer, a loss function, or the like, or any combination thereof. Before training, the model parameter(s) may have their respective initial values. For example, the processing device 120B may initialize parameter value(s) of the model parameter(s) of the preliminary model.

In some embodiments, the processing device 120B may obtain a non-trainable ODE solver (e.g., an Euler's algorithm, a midpoint algorithm, or an RK algorithm), and construct the preliminary model based on the non-trainable ODE solver. Merely by way of example, the processing device 140B may determine the structure of the preliminary model based on the Runge-Kutta algorithm. The RK algorithm refers to a family of implicit and explicit iterative methods, which includes, for example, an RK2 algorithm, an RK3 algorithm, an RK4 algorithm, or the like. Taking RK4 algorithm for instance, an initial value problem may be specified as Equation (7) as below:

$$\dot{y}=f(t,y'), y'(t_0)=y'_0, \qquad (7)$$

where y' refers to an unknown function of time t, $\dot{y}$ refers to the rate at which y' changes, $t_0$ refers to an initial time, and $y'_0$ refers to the value of y' at the initial time $t_0$ (or referred to as an initial value of y'). The initial value problem may be solved iteratively. For example, the value of y' at $t_{n+1}$ may be determined based on the value of y' at $t_n$ according to Equations (8) to (13) as below:

$$y'_{n+1} = y'_n + \frac{1}{6}(k1 + 2k2 + 2k3 + k4), \qquad (8)$$

$$t_{n+1} = t_n + h, \qquad (9)$$

$$k1 = hf(t_n, y'_n), \qquad (10)$$

$$k2 = hf\left(t_n + \frac{h}{2}, y'_n + \frac{k1}{2}\right), \qquad (11)$$

$$k3 = hf\left(t_n + \frac{h}{2}, y'_n + \frac{k2}{2}\right), \qquad (12)$$

$$k4 = hf(t_n + h, y'_n + k3), \qquad (13)$$

where $y'_{n+1}$ refers the value of y' at $t_{n+1}$, $y'_n$ refers to the value of y' at $t_n$, h refers to a step size of time, k1 refers to an increment based on the slope at the beginning of an interval between $t_n$ and $t_{n+1}$, k2 refers an increment based on the slope at the midpoint of the interval using $y'_n$ and k1, k3 refers to an increment based on the slope at the midpoint of the interval using $y'_n$ and k2, and k4 refers to an increment based on the slope at the end of the interval using $y'_n$ and k3.

Conventionally, the operators and the coefficients used in the RK4 algorithm, such as h, the coefficient of (k1+2k2+2k3+k4) in Equation (8), and/or the coefficients of k1, k2, k3, and k4 in Equations (8) to (13), may be determined according to experience. For example, the coefficients used in the RK4 algorithm may be determined based on a previously generated Butcher tableau. The systems and methods of the present disclosure may be used to design a specific preliminary model based on the RK4 algorithm. The operators and coefficients used in the RK4 algorithm (or a portion thereof) may be designed as unknown parameters of the preliminary model, the values of which may be automatically determined during the training of the preliminary model. Compared with the conventional method, the systems and methods may be more reliable and robust, insusceptible to human error or subjectivity, and/or fully automated. In addition, in certain embodiments, the preliminary model may be trained using training data of a specific area (e.g., MR data), the determined operators and coefficients may be more suitable for the specific area.

For illustration purposes, the following descriptions are described with reference to a preliminary model designed based on the RK4 algorithm as aforementioned, and not intended to limit the scope of the present disclosure. Merely by way of example, the preliminary model may include a first component corresponding to k1, a second component corresponding to k2, a third component corresponding to k3, a fourth component corresponding to k4, and a fifth component corresponding to $y'_{n+1}$. The input of the first component may include $y'_n$ and the output of the first component may include k1. The second component may be connected to the first component, the input of the second component may include $y'_n$ and k1, and the output of the second component may include k2. The third component may be connected to the second component, the input of the third component may include $y'_n$ and k2, and the output of the third component may include k3. The fourth component may be connected to the third component, the input of the fourth component may include $y'_n$ and k3, and the output of the fourth component may include k4. The fifth component may be connected to the first to fourth components, the input of the fifth component may include $y'_n$, k1, k2, k3, and k4, and the output of the fifth component may include $y'_{n+1}$. The operators and coefficients in Equations (8) to (13) may be designed as parameters of the first, second, third, fourth, and fifth components, respectively.

It should be noted that the above descriptions of the RK4 algorithm and the structure of the preliminary model are merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the equations (8) to (13) are illustrative and may be modified. As another example, the preliminary model designed based on the RK4 algorithm may include one or more additional components or be without one or more components described above.

In 630, the processing device 120B (e.g., the model generation module 450, the processing circuits of the processor 210) may generate the trained neural network model by iteratively updating values of the one or more model parameters of the preliminary model based on the plurality of training samples.

In some embodiments, the processing device 120B may update the model parameter(s) of the preliminary model by performing one or more iterations. For illustration purposes, a current iteration of the iteration(s) is described in the following description. The current iteration may be performed based on at least a portion of the training samples. In some embodiments, a same set or different sets of training samples may be used in different iterations in training the preliminary model.

For example, in the current iteration, for each of at least a portion of the plurality of training samples, the processing device 120B may generate a predicted MR image of the corresponding training object by inputting the training undersampled MR image into an updated preliminary model determined in a previous iteration. The processing device 120B may then determine a value of a loss function of the updated preliminary model based on the predicted MR image and the ground truth MR image of each of the at least a portion of the plurality of training samples. The loss function may be used to evaluate the accuracy and reliability of the updated preliminary model, for example, the smaller the loss function is, the more reliable the updated preliminary model is. For example, the loss function may include a mean square error (MSE) loss function or L1 loss function that measures a difference between the predicted MR image and the ground truth MR image of each of the at least a portion of the plurality of training samples.

As another example, in the current iteration, for each of at least a portion of the plurality of training samples, the processing device 126E may process the corresponding predicted MR image to generate a final predicted MR image. The processing device 120B may then determine the value of the loss function of the updated preliminary model based on the final predicted MR image and the ground truth MR image of each of the at least a portion of the plurality of training samples. The loss function may measure a difference between the final predicted MR image and the ground truth MR image of each of the at least a portion of the plurality of training samples. Merely by way of example, for a certain training sample, a plurality of intermediate MR images output by a plurality of sub-models in the updated preliminary model may be stored as a point in a coordinate system. Further, the processing device 120B may generate a curve by fitting the plurality of points corresponding to the plurality of intermediate MR images. According to the curve, the processing device 120B may perform an extrapolation (e.g., extending the curve) on the predicted MR image to obtain a final predicted MR image of the certain training sample. Further, the processing device 120B may update values of the one or more model parameters of the updated preliminary model to be used in a next iteration based on the value of the loss function.

In some occasion, an oscillation may occur in an iterative training process when the predicted MR images outputted by the updated preliminary model is close to the ground truth MR images. For example, the curve of a training sample may extend around the ground truth MR image of the training sample instead of getting close to the ground truth MR image. By performing the extrapolation, a final predicted MR image, which is more similar to the ground truth MR image may be generated. This may improve the accuracy of image reconstruction.

In some embodiments, the processing device 120B may determine whether the value of the loss function is minimized in the current iteration. For example, the value of the loss function may be regarded as being minimized if the value of the loss function obtained in the current iteration is less than a predetermined threshold value (e.g., a constant). As another example, the value of the loss function may be regarded as being minimized if a certain count of iterations is performed, or the loss function converges such that the differences of the values of the loss function obtained in consecutive iterations are within a threshold (e.g., a constant), etc. In response to a determination that the value of the loss function is minimized, the processing device 120B may design the updated preliminary model in the current iteration as the trained neural network model. In response to a determination that the value of the loss function is not minimized in the current iteration, the processing device 120B may further update the updated preliminary model to be used in the next iteration. In some embodiments, a model may include a plurality of parameter values, and updating the parameter values of the model refers to updating at least a portion of the plurality of parameter values of the model.

In some embodiments, to update values of the model parameter(s) of the updated preliminary model, the processing device 120B may determine a gradient descent according to an adjoint sensitivity algorithm based on the value of the loss function. The processing device 120B may further update values of the one or more model parameters of the updated preliminary model by backpropagating the gradient descent. For example, the processing device 120B may define an ODE F1 indicating a rate of change (denoted as a(t)) of the loss function relative to a state at different observation times. In certain embodiments, the ODE F1 may be solved backward in time, which may include both an original state and the sensitivity of the loss function with respect to the state. An original state of the ODE F1 may be a derivative of the loss function relative to the ground truth MR image(s) of the at least a portion of the training samples. A target state of the ODE F1 may be a derivative of the loss function relative to the training undersampled MR image(s) of the at least a portion of the training samples. The processing device 120B may determine a(t) by solving the ODE F1 using an ODE solver (e.g., an Euler's algorithm, a midpoint algorithm, or a Runge-Kutta algorithm). Further, the processing device 120B may determine the gradient descent based on a(t) according to Equation (14) as below:

$$\frac{dL}{d\theta} = -\int_{t_1}^{t_0} a(t)^T \frac{\partial f_f(z(t), t, \theta)}{\partial \theta} dt, \tag{14}$$

where L refers to the loss function, θ refers to the one or more model parameters of the updated preliminary model, z(t) refers to the ground truth MR images of the at least a portion of the training samples, and t refers to time. Further, the processing device 120B may update values of the one or more model parameters of the updated preliminary model by backpropagating the gradient descent.

In some embodiments, by using the adjoint sensitivity algorithm, the gradient descent may be determined without backpropagating through the operations of a neural ODE solver. In addition, there is no need to store intermediate quantities of the forward pass, which may allow the preliminary model to be trained with a constant (or substantially constant) memory cost as a function of depth. This may improve the training efficiency and reduce the training cost (e.g., a deeper model may be able to be generated with a certain memory cost). Moreover, the evaluation strategy of the neural ODE solver may be adapted automatically during model training to achieve a requested level of accuracy (e.g., by setting a predetermined threshold value of the loss function) and/or a desirable run time of the neural ODE solver in application.

It should be noted that the above description regarding the process 600 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, one or more operations may be added or omitted. For example, the trained neural network model may be stored in a storage device (e.g., the storage device 130) disclosed elsewhere in the present disclosure for further use (e.g., in MR image reconstruction as described in connection with FIG. 5). As another example, after the trained neural network model is generated, the processing device 120B may further test the trained neural network model using a set of testing images. As a further example, the processing device 120B may update the trained neural network model periodically or irregularly based on one or more newly-generated training images (e.g., new MR images generated in medical diagnosis).

In addition, although the descriptions regarding the process 600 describe that the trained neural network model is trained using a plurality of training samples, each of which includes a training undersampled MR image and a corresponding ground truth MR image, it should be understood that the trained neural network model may be trained using any other types of training data. Merely by way of example, each training sample may include undersampled k-space data and a corresponding ground truth MR image. In a current iteration in training the preliminary model, the processing device 120B may generate a predicted MR image of each training sample by inputting the undersampled k-space into the updated preliminary model.

FIG. 8 is a schematic diagram illustrating an exemplary cascade neural network model 800 according to some embodiments of the present disclosure. The cascade neural network model 800 may be an exemplary embodiment of a trained neural network model as described elsewhere in this disclosure (e.g., FIG. 5 and the relevant descriptions).

As shown in FIG. 8, the cascade neural network model 800 may include a plurality of sequentially connected sub-models, such as a first sub-model 810 and one or more second sub-models 820 (e.g., 821 and 822) downstream to the first sub-model 810. The first sub-model 810 may be configured to receive an input of the cascade neural network model 800 and generate an output. Each of the second sub-model 820 may be configured to receive an output of a previous model connected to the second sub-model 820 and generate an output. The output of the cascade neural network model may be the output of the last second sub-model, that is, the second sub-model 822. In some embodiments, different sub-models of the cascaded neural network 800 may be of a same type or different types. In certain embodiments, the sub-models of the cascaded neural network 800 may be of a same model having the same model parameters. This may reduce the amount of parameters of the cascaded neural network 800.

In some embodiments, the input of the cascade neural network model may include an initial value of an ODE as described in connection with operation 530, such as an undersampled MR image of an object. The output of the cascade neural network model may include an MR image of the object. Each of the sub-models may include a CNN model and a DC layer connected to the CNN model. The CNN model of each sub-model may be configured to process an input of the sub-model and generate an intermediate MR image of the object. The DC layer of each sub-model may be configured to output an updated intermediate MR image based on the intermediate MR image and undersampled k-space data of the object.

For example, in the first sub-model 810, the $CNN_1$ model may receive an undersampled MR image of the object and process the undersampled MR image to generate a first intermediate MR image. The undersampled MR image of the object may be obtained based on the undersampled k-space data of the object. The $CNN_1$ model may transmit the first intermediate MR image to the $DC_1$ layer of the first sub-model 810. The $DC_1$ layer may update the first intermediate MR image based on the undersampled k-space data. The $DC_1$ layer may further transmit the updated first intermediate MR image to the $CNN_2$ model of the second sub-model 821.

The $CNN_2$ model may process the updated first intermediate MR image and generate a second intermediate MR image. The $CNN_2$ model may further transmit the second intermediate MR image to the $DC_2$ layer of the second sub-model 821. The $DC_2$ layer may update the second intermediate MR image based on the undersampled k-space data. The last second sub-model 822 (e.g., the $DC_n$ layer of the last second sub-model 822) of the one or more second sub-models 820 may output the MR image of the object.

In some embodiments, a DC layer of a sub-model may update an intermediate MR image received from a corresponding CNN model based on the undersampled k-space data. For example, the DC layer may compare k-space data corresponding to the intermediate MR image with the undersampled k-space data. Based on the comparison result, a portion (denoted as K1) of the k-space data that is different from a corresponding portion (denoted as K2) of the undersampled k-space data may be identified, wherein the portion K1 and the portion K2 may be located at the same position in k-space. The DC layer may update the k-space data of the intermediate MR image by replacing the portion K1 with the portion K2 of the undersampled k-space data. The DC layer may further reconstruct the updated intermediate MR image based on the updated k-space data of the intermediate MR image. By using the DC layer, the data fidelity and the reconstruction accuracy may be improved.

It should be noted that the above description regarding the cascade neural network model 800 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the cascade neural network model may include one or more additional components or one or more components described above may be omitted. In some embodiments, the cascade neural network model 800 may further include a component connected to the last second sub-model 822 configured to perform an extrapolation on the MR image of the object to obtain a final MR image of the object. In such cases, the output of the cascade neural network model may be the final MR image of the object.

Figure 9:
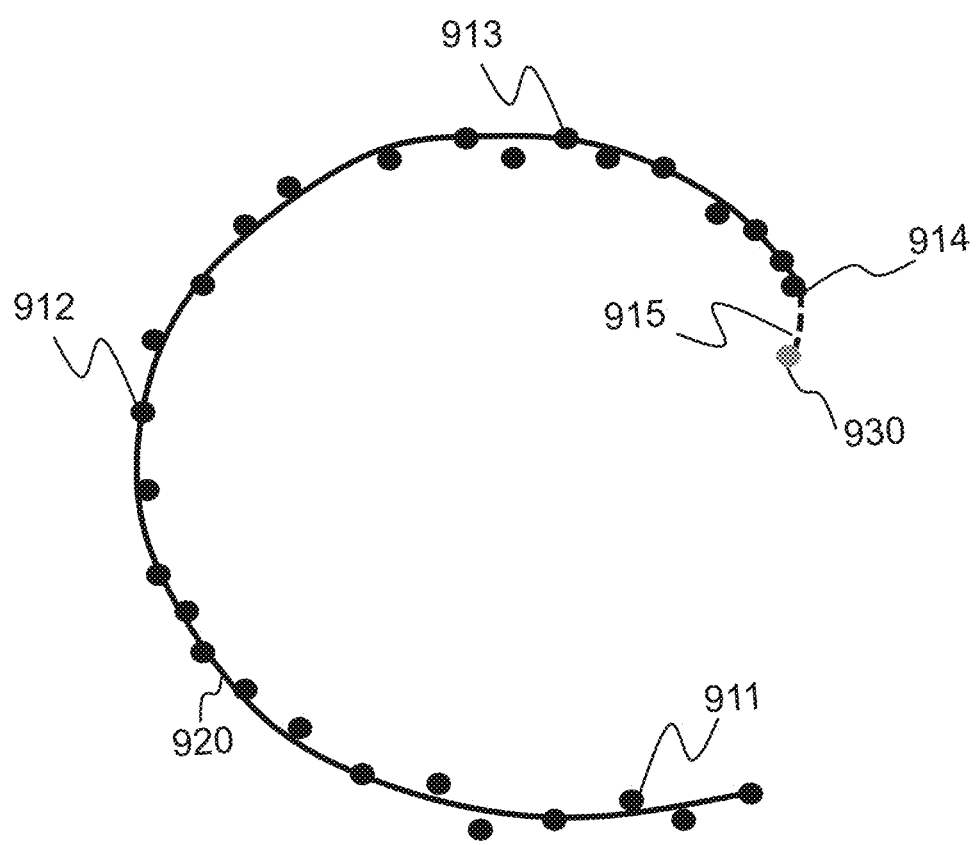
FIG. 9 is a schematic diagram illustrating an exemplary extrapolation according to some embodiments of the present disclosure.

FIG. 9 is a schematic diagram illustrating an exemplary extrapolation according to some embodiments of the present disclosure.

As described in connection with FIG. 5, a trained neural network model may be applied to solve an ODE to generate an MR image of an object, wherein an undersampled MR image may serve as an initial value of the ODE. An extrapolation may be performed on the generated MR image to generate a final MR image in order to improve the image quality. In some embodiments, the extrapolation may be performed based on one or more intermediate MR images generated by the trained neural network model during solving the ODE.

For example, the trained neural network model may be a cascade neural network model that includes a plurality of sub-models. The undersampled MR image may be inputted into the cascade neural network model, and each of the sub-models may output an intermediate MR image during application. The intermediate MR image outputted by the last sub-model may be designated as the MR image of the object. The processing device 120A may store the intermediate MR images output by the sub-models as a plurality of points (e.g., 911, 912, 913, and 914) as shown in FIG. 9. Further, the processing device 120A may determine a curve 920 by fitting the plurality of points. According to the curve 920, the processing device 120A may perform an extrapolation on the MR image of the object to obtain a final MR image of the object. For example, the processing device 120A may extend the curve 920 from the last point 914 (i.e., the point corresponds to the MR image) to a new point 930 based on, for example, the shape of the curve 920. A length of the extended portion 915 between the points 914 and 930 may be a default setting (e.g., an experience value) of the MRI system 100, set by a user, or adjusted by processing device 120A according to an actual need. The processing device 120A may then determine an image corresponding to the point 930 as the final MR image of the object.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

We claim:

1. A system for image reconstruction in magnetic resonance imaging (MRI), comprising:
    at least one storage device including a set of instructions; and
    at least one processor in communication with the at least one storage device, wherein when executing the set of instructions, the at least one processor is directed to perform operations including:
        obtaining undersampled k-space data associated with an object, the undersampled K-space data being generated based on magnetic resonance (MR) signals collected by an MR scanner that scans the object;
        formulating a reconstruction of an MR image based on the undersampled k-space data into a discrete optimization process;
        constructing an ordinary differential equation (ODE) by transforming the discrete optimization process into a continuous optimization process, the ODE modeling a rate of change of the reconstructed MR image over continuous time during the continuous optimization process; and
        generating the MR image of the object by solving the ODE based on the undersampled k-space data using an ODE solver, wherein the ODE is indicated by Equation as below:

$$\frac{d\hat{x}(t)}{dt} = f(\hat{x}(t), t, y, \theta),$$

where t refers to time, $\hat{x}(t)$ refers to the reconstructed MR image at time t, y refers to the undersampled K-space data, $f(\hat{x}(t),t,y,\theta)$ is a function representing a difference between the reconstructed MR images of two adjacent iterations, and θ refers to one or more parameters of $f(\hat{x}(t),t,y,\theta)$ other than t, $\hat{x}^k$, and y.

2. The system of claim 1, wherein the generating the MR image of the object by solving the ODE based on the undersampled k-space data using an ODE solver comprises:
    reconstructing an undersampled MR image of the object based on the undersampled k-space data as an initial value of the ODE; and
    generating the MR image of the object by solving the ODE based on the initial value using the ODE solver.

3. The system of claim 2, wherein the ODE solver is a trained neural network model, wherein the generating the MR image of the object by solving the ODE based on the initial value using the ODE solver comprises:
    obtaining the MR image of the object by inputting the undersampled MR image into the trained neural network model.

4. The system of claim 3, wherein the trained neural network model includes at least one of a Convolutional Neural Network (CNN) model, a convolutional Recurrent Neural Network (RNN) model, or a Cascaded Neural Network model.

5. The system of claim 3, the trained neural network model including a plurality of sequentially connected sub-models, the plurality of sequentially connected sub-models including a first sub-model and one or more second sub-models downstream to the first sub-model, wherein at least one of the one or more second sub-models includes:
    a convolutional model configured to process an output of a previous sub-model connected to the at least one sub-second model and generate an intermediate MR image; and
    a data consistency (DC) layer connected to the convolutional model configured to output an updated intermediate MR image based on the intermediate MR image and the undersampled k-space data, and wherein the MR image of the object is an output of the last second sub-model of the one or more second sub-models.

6. The system of claim 3, wherein the trained neural network model is generated according to a model training process, the model training process including:
    obtaining a plurality of training samples, each of the plurality of training samples including a training undersampled MR image and a corresponding ground truth MR image of a training object;
    obtaining a preliminary model having one or more model parameters; and
    generating the trained neural network model by iteratively updating values of the one or more model parameters of the preliminary model based on the plurality of training samples.

7. The system of claim 6, wherein the iteratively updating values of the one or more model parameters of the preliminary model includes performing an iterative operation including one or more iterations, and each of at least one iteration of the iterative operation includes:
    for each of at least a portion of the plurality of training samples, generating a predicted MR image of the corresponding training object by inputting the training undersampled MR image into an updated preliminary model determined in a previous iteration;
    determining, based on the predicted MR image and the ground truth MR image of each of the at least a portion of the plurality of training samples, a value of a loss function of the updated preliminary model; and
    further updating values of the one or more model parameters of the updated preliminary model to be used in a next iteration based on the value of the loss function.

8. The system of claim 7, wherein updating values of the one or more model parameters of the updated preliminary model to be used in a next iteration based on the value of the loss function includes:
    determining, based on the value of the loss function, a gradient descent according to an adjoint sensitivity algorithm; and
    updating values of the one or more model parameters of the updated preliminary model by backpropagating the gradient descent.

9. The system of claim 6, wherein obtaining a preliminary model having one or more model parameters includes:
   obtaining a non-trainable ODE solver; and
   constructing, based on the non-trainable ODE solver, the preliminary model having the one or more model parameters.

10. The system any of claim 1, wherein the ODE solver includes at least one of an Euler's algorithm, a midpoint algorithm, or a Runge-Kutta algorithm.

11. A method for image reconstruction in magnetic resonance imaging (MRI), the method being implemented on a computing device including at least one processor and at least one storage device, the method comprising:
   obtaining undersampled k-space data associated with an object, the undersampled K-space data being generated based on magnetic resonance (MR) signals collected by an MR scanner that scans the object;
   formulating a reconstruction of an MR image based on the undersampled k-space data into a discrete optimization process;
   constructing an ordinary differential equation (ODE) by transforming the discrete optimization process into a continuous optimization process, the ODE modeling a rate of change of the reconstructed MR image over continuous time during the continuous optimization process; and
   generating the MR image of the object by solving the ODE based on the undersampled k-space data using an ODE solver, wherein the ODE is indicated by Equation as below:

$$(dx\hat{}(t))/dt = f(x\hat{}(t), t, y, \theta),$$

where t refers to time, x(t) refers to the reconstructed MR image at time t, y refers to the undersampled K-space data, $f(\hat{x}(t), t, y, \theta)$ is a function representing a difference between the reconstructed MR images of two adjacent iterations, and $\theta$ refers to one or more parameters of $f(\hat{x}(t), t, y, \theta)$ other than t, $\hat{x}^k$, and y.

12. The method of claim 11, wherein the generating the MR image of the object by solving the ODE based on the undersampled k-space data using an ODE solver comprises:
   reconstructing an undersampled MR image of the object based on the undersampled k-space data as an initial value of the ODE; and
   generating the MR image of the object by solving the ODE based on the initial value using the ODE solver.

13. The method of claim 12, wherein the ODE solver is a trained neural network model, and the generating the MR image of the object by solving the ODE based on the initial value using the ODE solver comprises:
   obtaining the MR image of the object by inputting the undersampled MR image into the trained neural network model.

14. The method of claim 13, wherein the trained neural network model includes at least one of a Convolutional Neural Network (CNN) model, a convolutional Recurrent Neural Network (RNN) model, or a Cascaded Neural Network model.

15. The method of claim 13, the trained neural network model including a plurality of sequentially connected sub-models, the plurality of sequentially connected sub-models including a first sub-model and one or more second sub-models downstream to the first sub-model, wherein at least one of the one or more second sub-models includes:
   a convolutional model configured to process an output of a previous sub-model connected to the at least one sub-second model and generate an intermediate MR image; and
   a data consistency (DC) layer connected to the convolutional model configured to output an updated intermediate MR image based on the intermediate MR image and the undersampled k-space data, and wherein the MR image of the object is an output of the last second sub-model of the one or more second sub-models.

16. The method of claim 13, wherein the trained neural network model is generated according to a model training process, the model training process including:
   obtaining a plurality of training samples, each of the plurality of training samples including a training undersampled MR image and a corresponding ground truth MR image of a training object;
   obtaining a preliminary model having one or more model parameters; and
   generating the trained neural network model by iteratively updating values of the one or more model parameters of the preliminary model based on the plurality of training samples.

17. The method of claim 16, wherein the iteratively updating values of the one or more model parameters of the preliminary model includes performing an iterative operation including one or more iterations, and each of at least one iteration of the iterative operation includes:
   for each of at least a portion of the plurality of training samples, generating a predicted MR image of the corresponding training object by inputting the training undersampled MR image into an updated preliminary model determined in a previous iteration;
   determining, based on the predicted MR image and the ground truth MR image of each of the at least a portion of the plurality of training samples, a value of a loss function of the updated preliminary model; and
   further updating values of the one or more model parameters of the updated preliminary model to be used in a next iteration based on the value of the loss function.

18. A non-transitory computer readable medium, comprising executable instructions that, when executed by at least one processor, direct the at least one processor to perform a method, the method comprising:
   obtaining undersampled k-space data associated with an object, the undersampled K-space data being generated based on magnetic resonance (MR) signals collected by an MR scanner that scans the object;
   formulating a reconstruction of an MR image based on the undersampled k-space data into a discrete optimization process;
   constructing an ordinary differential equation (ODE) by transforming the discrete optimization process into a continuous optimization process, the ODE modeling a rate of change of the reconstructed MR image over continuous time during the continuous optimization process; and
   generating the MR image of the object by solving the ODE based on the undersampled k-space data using an ODE solver, wherein the ODE is indicated by Equation as below:

$$\frac{d\hat{x}(t)}{dt} = f(\hat{x}(t), t, y, \theta),$$

where t refers to time, $\hat{x}(t)$ refers to the reconstructed MR image at time t, y refers to the undersampled K-space data, $f(\hat{x}(t),t,y,\theta)$ is a function representing a difference between the reconstructed MR images of two adjacent iterations, and $\theta$ refers to one or more parameters of $f(\hat{x}(t),t,y,\theta)$ other than t, $\hat{x}^k$, and y.

\* \* \* \* \*